United States Patent
Beyer et al.

(10) Patent No.: US 8,524,591 B2
(45) Date of Patent: Sep. 3, 2013

(54) MAINTAINING INTEGRITY OF A HIGH-K GATE STACK BY PASSIVATION USING AN OXYGEN PLASMA

(75) Inventors: Sven Beyer, Dresden (DE); Rick Carter, Dresden (DE); Andreas Hellmich, Dresden (DE); Berthold Reimer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 372 days.

(21) Appl. No.: 12/848,644

(22) Filed: Aug. 2, 2010

(65) Prior Publication Data

US 2011/0049585 A1  Mar. 3, 2011

(30) Foreign Application Priority Data

Aug. 31, 2009 (DE) .................. 10 2009 039 419

(51) Int. Cl.
*H01L 29/78* (2006.01)
*H01L 21/336* (2006.01)
*H01L 21/28* (2006.01)

(52) U.S. Cl.
USPC ............ 438/595; 438/38; 438/474; 438/798; 438/656; 438/787; 438/785; 438/791; 438/958; 257/E23.132; 257/288; 257/E29.255; 257/E21.409

(58) Field of Classification Search
USPC .......... 257/288, E23.132, E29.255, E21.409; 438/38, 474, 798, 656, 787, 785, 791, 595, 438/958

See application file for complete search history.

(56) References Cited

U.S. PATENT DOCUMENTS

| | | | | |
|---|---|---|---|---|
| 6,528,399 B1 | | 3/2003 | Alieu et al. | 438/561 |
| 7,033,874 B2 * | | 4/2006 | Itonaga et al. | 438/197 |
| 8,106,456 B2 * | | 1/2012 | Khater | 257/347 |
| 8,173,531 B2 * | | 5/2012 | Fang et al. | 438/585 |
| 2004/0121526 A1 * | | 6/2004 | Yamamoto | 438/142 |
| 2005/0261151 A1 | | 11/2005 | Lee et al. | 510/175 |
| 2006/0160317 A1 * | | 7/2006 | Zhu et al. | 438/322 |
| 2006/0284271 A1 * | | 12/2006 | Doyle et al. | 257/410 |
| 2009/0117726 A1 * | | 5/2009 | Pas | 438/592 |

OTHER PUBLICATIONS

Translation of Official Communication from German Patent Office for German Patent Application No. 10 2009 039 419.2 dated Jan. 27, 2011.
PCT Search Report and Written Opinion from PCT/US2010/046568 dated Feb. 11, 2011.
Burkman et al., Handbook of Semiconductor Wafer Cleaning Technology, Chapter 3 Aqueous Cleaning Processes, Noyes Publications, Westwood, NJ, pp. 111-197, 1993.

* cited by examiner

*Primary Examiner* — Matthew Reames
*Assistant Examiner* — Banjamin Tzu-Hung Liu
(74) *Attorney, Agent, or Firm* — Williams, Morgan & Amerson, P.C.

(57) ABSTRACT

In semiconductor devices, integrity of a titanium nitride material may be increased by exposing the material to an oxygen plasma after forming a thin silicon nitride-based material. The oxygen plasma may result in an additional passivation of any minute surface portions which may not be appropriately covered by the silicon nitride-based material. Consequently, efficient cleaning recipes, such as cleaning processes based on SPM, may be performed after the additional passivation without undue material loss of the titanium nitride material. In this manner, sophisticated high-k metal gate stacks may be formed with a very thin protective liner material on the basis of efficient cleaning processes without unduly contributing to a pronounced yield loss in an early manufacturing stage.

22 Claims, 3 Drawing Sheets

MAINTAINING INTEGRITY OF A HIGH-K GATE STACK BY PASSIVATION USING AN OXYGEN PLASMA

BACKGROUND OF THE INVENTION

1. Field of the Invention

Generally, the present disclosure relates to the fabrication of highly sophisticated integrated circuits including advanced transistor elements that comprise strain-inducing semiconductor alloys and gate structures of increased capacitance including a high-k gate dielectric and a metal-containing cap layer.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of integrated circuits, field effect transistors represent one important type of circuit element that substantially determines performance of the integrated circuits. Generally, a plurality of process technologies are currently practiced for forming field effect transistors, wherein, for many types of complex circuitry, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, which in turn causes an increase of gate resistivity due to the reduced dimensions, is a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or other materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 80 nm may require a gate dielectric made of silicon dioxide as thin as approximately 1.2 nm. Although usage of high speed transistor elements having an extremely short channel may be restricted to high speed signal paths, whereas transistor elements with a longer channel may be used for less critical circuit portions, such as storage transistor elements, the relatively high leakage current caused by direct tunneling of charge carriers through an ultra-thin silicon dioxide gate insulation layer may reach values for an oxide thickness in the range of 1-2 nm that may not be compatible with requirements for many types of circuits, even if only transistors in speed critical paths are formed on the basis of an extremely thin gate oxide.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode so as to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides an increased capacitance based on the same thickness as a silicon dioxide layer, while, additionally, leakage currents are kept at an acceptable level. On the other hand, the non-polysilicon material, such as titanium nitride and the like, may be formed so as to connect to the high-k dielectric material, thereby substantially avoiding the presence of a depletion zone.

After forming sophisticated gate structures including a high-k dielectric and a metal-based gate material, however, high temperature treatments may be required, which may result in a shift of the work function and a reduction of the permittivity of the gate dielectric, which may also be associated with an increase of layer thickness, thereby offsetting many of the advantages of the high-k dielectric in combination and the metal material. It is believed that the deterioration of the high-k metal gate is substantially caused by the incorporation of oxygen and a respective oxygen diffusion within the high-k dielectric material, wherein the oxygen diffusion may be fed by oxygen contained in the ambient that may come into contact with the high-k dielectric during the processing of the devices. Since, for instance, hafnium- and zirconium-based oxides grow very fast due to the high affinity to oxygen diffusion even at moderate temperatures, a significant modification of the characteristics of the high-k dielectric material may be observed, for instance, an increased layer thickness and thus a reduced dielectric constant, which may be even further pronounced at moderately high temperatures of approximately 950-300°, as may typically be used during activation treatments and the like.

In addition to a significant modification of the high-k dielectric material, the work function of the metal in the gate stack may also be shifted towards the center of the band gap, thereby modifying the threshold voltage of respective transistors. Due to the high oxygen affinity of the high-k dielectric material and due to the exposure to wet chemical etch procedures and cleaning processes, the gate stack is usually encapsulated after the patterning process in order to enhance stability of the high-k dielectric material and the respective metals in the gate stack. For this purpose, silicon nitride has proven to be a promising material due to its oxygen blocking characteristics. Hence, in typical conventional process flows, a silicon nitride liner with a thickness in the range of approximately 1-5 nm may be formed on exposed surface areas of the patterned high-k gate stack, wherein appropriate deposition techniques are used so as to not unduly affect device characteristics and/or the subsequent manufacturing steps. For example, well-established low pressure chemical vapor deposition (LPCVD) techniques may be applied for forming the silicon nitride liner.

In addition to providing sophisticated gate electrode structures by using high-k dielectric materials and metal-containing gate electrode materials, other approaches have been developed in order to enhance transistor performance for a given gate length and a thickness of a gate dielectric material. For example, by creating a certain strain component in the channel region of the transistor elements, the charge carrier mobility and thus the overall conductivity of the channel may be enhanced. For a silicon material having a standard crystallographic configuration, i.e., a (100) surface orientation with the channel length direction oriented along a <110> equivalent direction, the creation of a tensile strain component in the current flow direction may enhance conductivity of electrons, thereby improving transistor performance of N-channel transistors. On the other hand, generating a compressive strain component in the current flow direction may increase hole mobility and thus provide superior conductivity in P-channel transistors. Consequently, a plurality of strain-inducing mechanisms have been developed in the past which may per se require a complex manufacturing sequence for implementing the various strain-inducing techniques. For example, one promising approach that is frequently applied is the incorporation of a compressive strain-inducing silicon/germanium alloy in the drain and source areas of P-channel transistors. For this purpose, in an early manufacturing stage, cavities are formed selectively adjacent to the gate electrode structure of the P-channel transistor, while the N-channel transistors are covered by a spacer layer. Additionally, the gate electrode of the P-channel transistor has to be encapsulated in order to not unduly expose the gate electrode material to the etch ambient for forming the cavities and also for providing an efficient growth mask during the selective epitaxial growth process, in which the silicon/germanium alloy may be grown on a crystalline substrate material, while a significant deposition of the alloy on dielectric surface areas may be suppressed by appropriately selecting the corresponding process parameters. After forming the strain-inducing silicon/germanium alloy, the corresponding spacer structure and a cap layer encapsulating the gate electrode of the P-channel transistor may be removed along with the spacer layer that covers the N-channel transistors. Thereafter, the further processing may be continued by forming drain and source regions so as to complete the basic transistor configuration.

The above-described strain-inducing mechanism is a very efficient concept for improving transistor performance of P-channel transistors and thus a combination with sophisticated gate electrode structures on the basis of a high-k dielectric material is highly desirable. The efficiency of the finally obtained strain component in the channel region of the transistor, however, strongly depends on the internal strain level of the semiconductor alloy and from the lateral offset from the channel region. Since the material composition may be restricted to a concentration of approximately 30 atomic percent germanium in a silicon/germanium alloy based on currently available sophisticated selective epitaxial deposition recipes, further improvement of the strain may require a reduction of the lateral offset, which in turn, however, is correlated with the thickness of any protective dielectric materials on sidewalls of the gate electrode structure. Consequently, the protective silicon nitride liner, which may be provided to enhance integrity of the sensitive gate electrode structure during the further processing for completing the transistor configuration, may be reduced in thickness, for instance in combination with any additional offset spacer elements that may be required, which may, however, result in severe yield losses due to material loss in the gate electrode structure. Without intending to restrict the present application to the following explanation, it is believed that any patterning irregularities, in particular at the foot of complex gate electrode structures, may result in inferior coverage of this area when further reducing the thickness of the silicon nitride liner material. That is, upon patterning the complex gate layer stack, a lateral increase of gate length may frequently occur at the foot of the gate electrode structures, at least for one type of transistor element, which may thus result in a reduced degree of coverage by the silicon nitride material, thereby increasing the probability of an interaction with aggressive chemical agents during the further processing of the semiconductor device. For instance, an SPM solution (a mixture of sulfuric acid and hydrogen peroxide) has been proven to be a very efficient cleaning agent after encapsulating the gate electrode structure and prior to the further processing in order to remove contaminants, metal residues and the like. Omitting the cleaning step in this manufacturing stage or providing a less efficient cleaning recipe may significantly increase overall defectivity, which may thus result in a significant yield loss. On the other hand, the inferior degree of coverage at the foot of the gate electrode structures of at least some transistors may result in an interaction with the sulfuric acid, which has the tendency of removing significant amounts of the titanium nitride material, even if only very minute non-covered surface portions thereof are available for an interaction with the sulfuric acid. While an increase of protective silicon nitride material on sidewalls of the gate electrode structures may significantly reduce the probability of a titanium nitride loss during a cleaning process performed on the basis of SPM, the resulting loss in performance of transistors, such as P-channel transistors, due to a less efficient strain-inducing mechanism, may make this solution less than desirable. On the other hand, omitting the SPM-based cleaning process may not represent a viable option due to the drastically increased defect rate during the further processing of the semiconductor devices.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides semiconductor devices and techniques in which very efficient wet chemical cleaning recipes may be applied in order to reduce the defect rate, wherein sensitive titanium nitride surface areas may be protected by a very thin dielectric material, such as silicon nitride, while nevertheless providing superior integrity of the titanium nitride material, irrespective of a deteriorated degree of coverage, for instance, caused by deposition-related irregularities when depositing the protective dielectric material. To this end, an oxygen-based treatment may be performed, for instance in the form of an oxygen plasma treatment, which surprisingly may result in superior integrity of critical surface areas of the titanium nitride material. In some illustrative embodiments disclosed herein, the oxygen treatment may be applied to a sophisticated gate electrode structure, in which a silicon nitride-based material may be provided with a desired small layer thickness in view of the further processing of the semiconductor device. Consequently, in this case, an additional passivation of minute surface areas with an extremely thin protective material or with protective dielectric material may be accomplished, thereby providing enhanced chemical stability during the further processing, for instance by applying any wet chemical etch recipes. Consequently, a desired reduced layer thickness of a protective liner material, such as a silicon nitride material, may be applied in combination with efficient cleaning strategies, while nevertheless suppressing a pronounced titanium nitride loss.

One illustrative method disclosed herein relates to the processing of a material system of a semiconductor device. The method comprises depositing a dielectric material on exposed surface areas of a titanium nitride material, which is formed above a substrate of the semiconductor device. The method further comprises exposing the substrate to an oxygen plasma and removing, after exposure to the oxygen plasma, contaminants from the dielectric material by performing a cleaning process on the basis of sulfuric acid. Additionally, the method comprises performing one or more further processes on the semiconductor device in the presence of the dielectric material and the titanium nitride material.

A further illustrative method disclosed herein comprises forming a gate electrode structure on a semiconductor region of a semiconductor device, wherein the gate electrode structure comprises a titanium nitride layer. The method further comprises forming a protective liner on sidewalls of the gate electrode structure and performing a treatment on the basis of an oxygen species in a substantially acid-free environment. The method further comprises performing a cleaning process on the gate electrode structure that includes the protective liner on the basis of sulfuric acid. Additionally, a transistor element is formed by using the gate electrode structure that includes the protective liner.

One illustrative transistor device disclosed herein comprises a gate electrode structure comprising a titanium nitride material formed on a gate insulation layer that comprises a high-k dielectric material. The transistor device further comprises a spacer structure formed on sidewalls of the gate electrode structure, wherein the spacer structure comprises a protective liner that is in direct contact with a first portion of a sidewall face of the titanium nitride material. Additionally, the transistor device comprises a titanium oxide material formed at a second portion of the sidewall face of the titanium nitride material.

BRIEF DESCRIPTION OF THE DRAWINGS

The disclosure may be understood by reference to the following description taken in conjunction with the accompanying drawings, in which like reference numerals identify like elements, and in which.

Figure 1A:
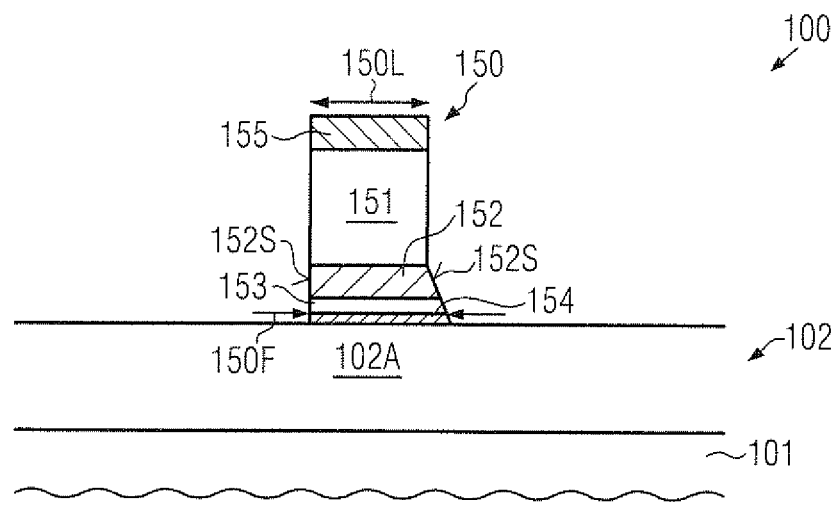
FIGS. 1a-1d schematically illustrate cross-sectional views of a semiconductor device during various manufacturing stages in enhancing integrity of a titanium nitride material provided in a material layer stack, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure addresses the problem of encapsulation of titanium nitride material during the processing of semiconductor devices. Recently, titanium nitride has become a frequently used material, which may require a certain degree of passivation during the further processing, for instance during high temperature processes, chemical cleaning processes and the like, in order to avoid a pronounced change in material characteristics, which may thus result in a deterioration of the finished semiconductor device. For this purpose, silicon nitride-based dielectric materials have proven to be very efficient materials for passivating exposed surface areas of a titanium nitride material, for instance in view of oxygen diffusion and the like. In sophisticated semiconductor devices, the overall shrinkage of device dimensions may also require an adaptation of layer thickness in combination with very complex conditions during the patterning of complex material systems, which may frequently result in patterning-related irregularities, thereby also providing very sophisticated conditions during the deposition of a thin protective liner material. Consequently, a desired uniform degree of coverage of any exposed surface areas of a titanium nitride material may frequently be difficult to achieve without requiring an increased layer thickness, which may frequently not be compatible with other device requirements. Since a reduced degree of coverage of the sensitive titanium nitride material may result in a very pronounced change of the overall material characteristics, for instance upon interaction with sulfuric acid and any related wet chemical agents, the present disclosure is based on the surprising finding that exposure to a reactive oxygen-containing ambient, in one illustrative embodiment an oxygen-based plasma ambient, may result in a very efficient passivation of exposed surface areas of the titanium nitride material, which may thus result, in combination with the material which may cover the main portion of an exposed titanium nitride surface, in superior integrity. It is believed that, during the oxygen treatment, a titanium and oxygen-containing compound may be locally formed which may, for convenience, also be referred to as a titanium oxide-based material, which may exhibit a significantly reduced etch rate when exposed to sulfuric acid. Consequently, efficient cleaning recipes may be applied on the basis of sulfuric acid, wherein the protective liner material, such as the silicon nitride material, may provide sufficient etch resistivity, while any non-covered portions may have been passivated by the oxygen treatment so as to exhibit a reduced etch rate, which may thus, for instance, substantially avoid any undue material loss of the titanium nitride layer, as is for instance previously explained with reference to the processing of sophisticated gate electrode structures.

Consequently, in some illustrative embodiments, the additional passivation based on an oxygen treatment, such as an oxygen plasma, may be efficiently applied upon forming high-k metal gate structures, for instance after forming a thin protective liner material, the thickness of which may be selected in view of other device requirements, such as a minimum lateral offset of a strain-inducing semiconductor alloy and the like, wherein the desired superior integrity may be achieved by the additional passivation.

FIG. 1a schematically illustrates a cross-sectional view of a semiconductor device 100 which may comprise a substrate 101, such as a silicon substrate, an insulating carrier material and the like, above which is formed a semiconductor layer 102. The semiconductor layer 102 may represent a silicon-based material or may comprise any other appropriate components as may be required in this manufacturing stage. For example, isolation structures (not shown) may laterally delineate an active region 102A in the semiconductor layer 102, which is to be understood as a semiconductor region, in and above which one or more transistor elements are to be formed. Furthermore, the semiconductor layer 102 in combination with the substrate 101 may represent a silicon-on-insulator (SOI) configuration when a buried insulating material (not shown) may be formed below the semiconductor material 102 and in contact therewith. In other cases, the semiconductor layer 102 may represent a portion of a crystalline semiconductor material of the substrate 101, thereby forming a "bulk" configuration. Moreover, in the embodiment shown in FIG. 1a, a material system 150 may be formed above the semiconductor layer 102 and may include a plurality of material layers 154, 153, 152, 151 and 155, wherein the number and the composition of these material layers may depend on the overall device requirements. One of the material layers of the system 150, such as the material layer 152, may be provided in the form of a titanium nitride material which may have exposed surface areas 152S, which in the embodiment shown may represent sidewall surface areas of the layer 152. In one illustrative embodiment, the material system 150 may represent a gate electrode structure of a transistor still to be formed in and above the active region 102A. In this case, the layers 154 and 153 may represent a gate dielectric material, in which the layer 153 may represent a high-k dielectric material, such as one of the materials mentioned above, while the layer 154 may represent a silicon oxide-based dielectric material, thereby providing superior interface characteristics with the active region 102A. The titanium nitride material 152 may thus be formed on the high-k dielectric material 153 so as to passivate and thus protect the high-k dielectric material 153. Furthermore, one or more additional materials, such as a silicon material in the form of a polysilicon material, an amorphous silicon material and the like, may be provided as the layer 151, wherein it should be appreciated that any other appropriate materials, such as a silicon/germanium material and the like, may be used if considered appropriate. Furthermore, the cap material 155, such as a silicon nitride material, may be formed at the top of the material system 150 when representing a gate electrode structure. It should be appreciated that additional materials, such as intermediate etch stop materials and the like, may also be provided in the material system 150, if required.

The semiconductor device 100 comprising the material system 150, which will hereinafter be referred to as the gate electrode structure, may be formed on the basis of the following processes. After defining the active region 102A by forming appropriate isolation structures using any appropriate process strategy, the material layers for the system 150 may be deposited and subsequently patterned on the basis of sophisticated lithography and etch techniques. It should be appreciated that a portion of the material layers may be deposited and may be patterned first, wherein, typically, at least the titanium nitride material 152 may be formed on the layer 153 in order to provide superior integrity of the material layer 153. Upon patterning the material layer stack, in particular the layers 154, 153 and 152, a certain degree of non-uniformity may occur when applying sophisticated anisotropic etch techniques. For example, during the patterning sequence, an etch process may have to etch through the cap layer 155 and the electrode material 151, followed by the titanium nitride material 152 and the gate dielectric materials 153 and 154. During the corresponding patterning process, a non-uniform advance of the etch front may be created, which may result in a different lateral dimension of the resulting gate electrode structure 150. For instance, it may be observed that the gate electrode structures of certain types of transistors, such as N-channel transistors, may have an increased length 150F at the foot or bottom of the gate electrode structure 150 compared to a length 150L at the top thereof. Consequently, one or both surface areas 152S of the titanium nitride material 152, and also of the layers 153 and 154, may represent an inclined surface area, which may result in inferior coverage upon depositing a thin protective liner material in a subsequent manufacturing stage.

Figure 1B:
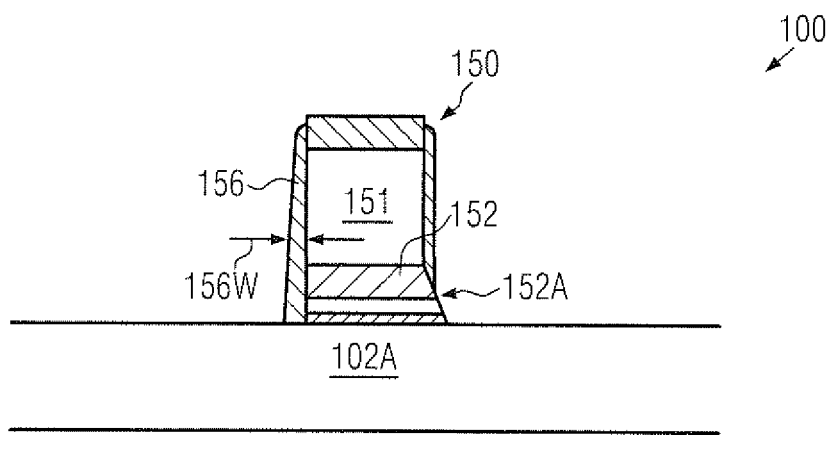

FIG. 1b schematically illustrates the semiconductor device 100 in a further advanced manufacturing stage in which a protective liner 156 may be formed on sidewalls of the gate electrode structure 150. In some illustrative embodiments, the protective liner 156 may be comprised of a silicon nitride-based material, which is to be considered as a silicon and nitrogen compound, which may possibly include other species, such as hydrogen and the like. In other cases, other dielectric materials, such as nitrogen-containing silicon carbide and the like, may be used, as long as these materials provide a high etch resistivity and pronounced oxygen diffusion blocking effects during the further processing of the semiconductor device 100. In some illustrative embodiments, a width 156W of the liner 156 may be 5 nm and less and, in some embodiments, 3 nm and less, since the liner 156, possibly in combination with an additional spacer element, may determine a lateral offset for a strain-inducing semiconductor alloy which may have to be formed in at least some transistor elements in a later manufacturing stage. As illustrated, the protective liner 156 may not completely cover the sidewall of the titanium nitride material 152 due to the inclined surface area, or a portion 152A may be covered with an extremely thin material layer, which may be readily opened during the further processing of the device 100.

The protective liner 156 may be formed by depositing a dielectric material layer, such as a silicon nitride layer, on the basis of any appropriate deposition technique, such as thermally activated chemical vapor deposition (CVD), plasma enhanced CVD or any combination thereof, or any other cyclic deposition technique, if a superior layer thickness control is required. For example, silicon nitride material may be formed as a very dense material, thereby providing superior integrity of the sidewalls of the gate electrode structure 150. After the deposition of the dielectric material layer, an anisotropic etch process may be performed on the basis of well-established process recipes, thereby efficiently removing the dielectric material from horizontal device areas. Due to the inclined surface area, material may also be removed from the bottom of the gate electrode structure 150 (see right-hand side of FIG. 1b), which may result in the substantially non-covered portion 152A. As previously explained, in conventional strategies, the non-covered portion 152A may not allow efficient cleaning recipes on the basis of sulfuric acid since a significant material loss in the layer 152 would occur.

Figure 1C:
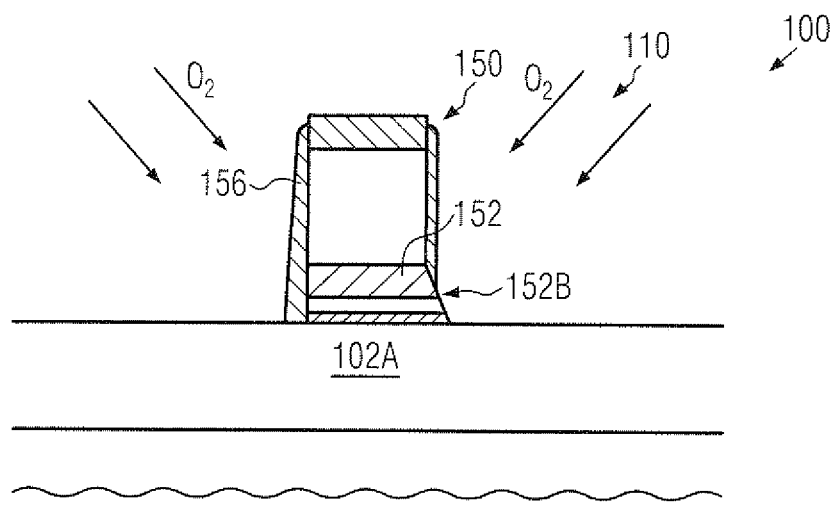

FIG. 1c schematically illustrates the semiconductor device 100 when exposed to a reactive oxygen-containing ambient 110 in order to passivate any exposed surface portions of the titanium nitride material 152. In one illustrative embodiment, the treatment 110 may be performed as an oxygen plasma, in which the exposed portion 152A (FIG. 1b) may be efficiently converted into a titanium and oxygen-containing material 152B, which may have a significantly reduced etch rate when exposed to sulfuric acid and other aggressive acids, as may typically be used in efficient cleaning recipes. Appropriate plasma parameters for the process 110 may be readily established based on conventional oxygen resist strip recipes, wherein a desired degree of titanium nitride passivation may be determined by performing corresponding experiments in which the resulting etch resistivity of a titanium nitride material may be determined for a plurality of different process parameter settings. For instance, a typical oxygen plasma ambient as used for ashing resist material may be applied for approximately 5-60 seconds in order to efficiently convert titanium nitride material into the chemically stable material 152B. In other illustrative embodiments, the treatment 110 may be established in an acid-free environment without applying a plasma, wherein a chemical interaction may be initiated by elevated temperature, such as approximately 150-300° C.

Figure 1D:
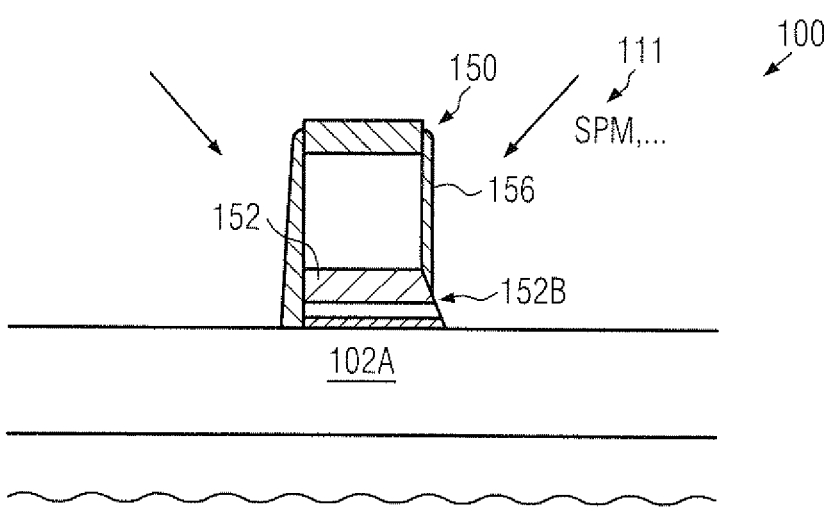

FIG. 1d schematically illustrates the semiconductor device 100 when exposed to a reactive process ambient 111, which may be established on the basis of sulfuric acid, to efficiently remove contaminants, such as polymers, metals and the like. During the process 111, which, in one illustrative embodiment, may be established on the basis of SPM, the protective liner 156 in combination with the passivated portion 152B of the titanium nitride material 152 may provide superior integrity, thereby significantly suppressing any modifications of the remaining titanium nitride material 152. Consequently, the further processing of the semiconductor device 100 may be continued on the basis of an efficiently cleaned device surface, thereby reducing any yield losses caused by any contamination-related defects.

Figure 1E:
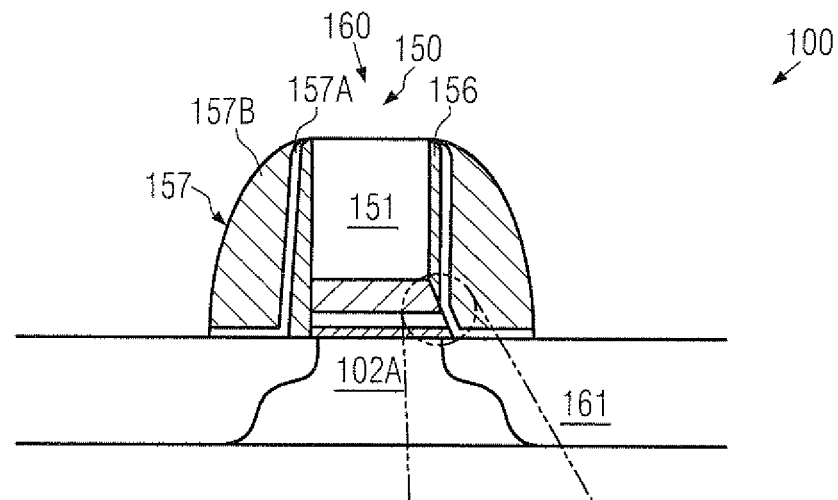
FIG. 1e schematically illustrates a cross-sectional view of a transistor element including a gate electrode structure in which a titanium nitride material may receive superior integrity by an additional oxygen-based passivation process, according to illustrative embodiments.

FIG. 1e schematically illustrates the semiconductor device 100 in a further advanced manufacturing stage. As illustrated, the device 100 may comprise a transistor 160, including drain and source regions 161 formed in the active region 102A. Furthermore, a sidewall spacer structure 157 may be formed on sidewalls of the gate electrode structure 150, i.e., on the protective liner material 156. In the embodiment shown, the spacer structure 157 may comprise an etch stop liner 157A and a spacer element 157B, wherein, however, additional spacer elements may be provided, depending on the required complexity of the dopant profile of the drain and source regions 161.

Figure 1F:
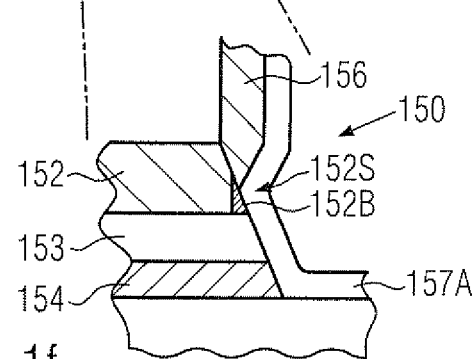
FIG. 1f schematically illustrates an enlarged view of a bottom portion of the gate electrode structure, according to illustrative embodiments.

FIG. 1f schematically illustrates an enlarged view of a bottom portion of the gate electrode structure 150. As shown, the titanium nitride material 152 may have formed on its sidewall surface 152S the protective liner 156 and the passivated titanium oxide-based material 152B, while the sidewalls of the gate dielectric materials 153, 154 may be covered by the etch stop liner 157A.

The semiconductor device 100 as shown in FIGS. 1e and 1f may be formed in accordance with any appropriate process technique, for instance by forming offset spacer elements (not shown), or by using the protective liner 156 as an offset spacer element for introducing a dopant species and subsequently forming the sidewall spacer structure 157, which may then be used for introducing a further portion of the dopant species in order to obtain the drain and source regions 161. Thereafter, any anneal processes may be performed so as to activate the dopant species and re-crystallize implantation-induced damage. Thereafter, the further processing may be continued, for instance, by forming metal silicide regions, if required, and depositing an interlayer dielectric material, for instance in the form of silicon nitride and silicon dioxide and the like. It should be appreciated that, in some sophisticated approaches, the material 151 may be replaced by one or more additional metal species, wherein the titanium nitride material 152 may be efficiently used as a stop material, wherein the superior integrity thereof may thus provide superior process conditions. In other cases, the gate electrode structure 150 may have a final configuration, for instance with respect to work function adjustment and the like, wherein the superior integrity of the titanium nitride material 152 may result in superior uniformity of the finally achieved transistor characteristics.

Figure 1G:
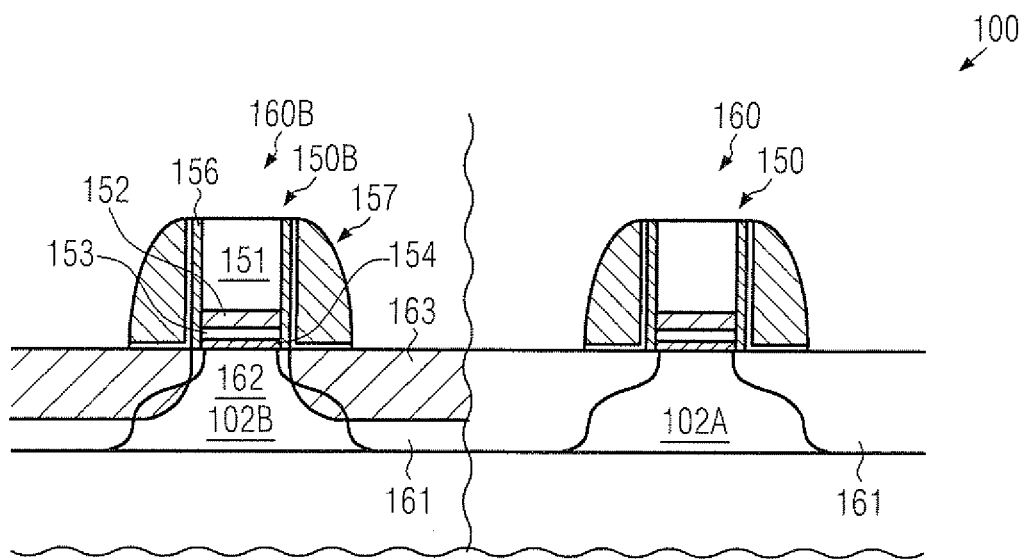
FIG. 1g schematically illustrates a cross-sectional view of the semiconductor device according to illustrative embodiments in which at least one transistor element may receive a strain-inducing semiconductor alloy with a reduced offset that is determined on the basis of a thin protective liner material formed on the sophisticated gate electrode structure.

FIG. 1g schematically illustrates the semiconductor device 100 according to further illustrative embodiments in which a further transistor element 160B may be formed in and above an active region 102B and may comprise a gate electrode structure 150B, which may have a similar configuration as the gate electrode structure 150. That is, the gate electrode structure 150B may comprise the gate dielectric materials 154 and 153 in combination with the titanium nitride material 152. Moreover, an electrode material 151 may be formed above the titanium nitride material 152. Additionally, the protective liner material 156 may be formed on sidewalls of the gate electrode structure 160B, which may further comprise the spacer structure 157. In the embodiment shown, the gate electrode structure 160B may have a substantially uniform cross-sectional shape so that a protective liner material 156 may reliably cover the sidewalls of the layers 154, 153 and 152. As previously explained, during the patterning of gate electrode structures of different types of transistors, the cross-sectional shape may be different. Furthermore, in some approaches, the active region 102B may have formed thereon, at least partially, an additional semiconductor material, which may be provided so as to obtain the desired work function and thus threshold voltage of the transistor 160B. For example, a silicon/germanium alloy may be efficiently used for adjusting an appropriate band gap offset with respect to the dielectric materials 154 and 153, which may have incorporated therein a specific work function metal species. Moreover, the transistor 160B, which may represent a P-channel transistor, may have incorporated a strain-inducing semiconductor alloy 163 such as a silicon/germanium alloy and the like which may induce a certain strain component in a channel region 162. As explained above, the resulting strain component in the channel region 162 may strongly depend on the lateral offset of the material 163, which in turn may be determined on the width of the protective liner material 156. That is, when forming the strain-inducing semiconductor alloy 163, the gate electrode structure 150B including the protective liner material 156, possibly in combination with an additional liner material, may act as an etch mask and growth mask for forming respective cavities in the active region 102B and refilling the cavities with the semiconductor alloy 163. During the cavity etch, at least in an initial phase of the etch process, a highly anisotropic etch recipe may be used so that the lateral offset of the resulting cavity may be substantially determined by any dielectric material formed on sidewalls of the gate electrode structure 150B. Consequently, a reduced thickness of the liner material 156 may be advantageous in view of enhancing the overall strain-inducing efficiency of the material 163. Since a reduced thickness or width of the material 156 may not substantially negatively affect the overall processing of the device 100, for instance in the transistor 160, which may have the non-uniform gate length, a desired reduced offset may be achieved in the transistor 160B. Consequently, the transistors 160B and 160 may be formed on the basis of any appropriate process technique, wherein a desired reduced width or thickness of the protective liner materials 156 may result in superior performance of the transistor 160B.

It should be appreciated that any appropriate strain-inducing semiconductor alloys, such as silicon/carbon, may be used, depending on the type of strain required for enhancing transistor performance. For example, the transistor 160 when representing an N-channel transistor may receive a silicon/carbon alloy for inducing a tensile strain in the active region 102A, which may thus result in superior performance of the transistor 160. Similarly, both transistors 160 and 160B may receive an appropriate strain-inducing semiconductor alloy, wherein the reduced width of the liner material 156 in combination with the reduced defect rate achieved on the basis of the efficient cleaning process (FIG. 1d) may result in enhanced performance and reduced yield losses.

As a result, the present disclosure provides semiconductor devices and process strategies in which integrity of a titanium nitride material may be enhanced on the basis of an oxygen treatment, such as a plasma treatment, which surprisingly enhances integrity of non-covered surface portions by increasing the chemical stability of these portions with respect to exposure to efficient cleaning recipes, for instance based on sulfuric acid.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of processing a material system of a semiconductor device, the method comprising:
depositing a dielectric material on at least some exposed surface areas of a titanium nitride material, said titanium nitride material being formed above a substrate of said semiconductor device;
after depositing said dielectric material, passivating at least one exposed surface area of said titanium nitride material by exposing said substrate to an oxygen plasma;

after exposing said substrate to said oxygen plasma, removing contaminants from said dielectric material by performing a cleaning process on the basis of sulfuric acid; and performing one or more further processes on said semiconductor device in the presence of said dielectric material and said passivated titanium nitride material.

2. The method of claim 1, wherein said dielectric material is deposited with a thickness of approximately 5 nm or less.

3. The method of claim 1, wherein said dielectric material comprises silicon and nitrogen.

4. The method of claim 1, further comprising forming a material layer stack including said titanium nitride material, and wherein said dielectric layer is formed on sidewalls of said material layer stack.

5. The method of claim 4, wherein forming said material layer stack comprises forming a gate dielectric layer on a semiconductor region, forming said titanium nitride material above said gate dielectric layer, forming at least one further material layer on said titanium nitride material and patterning said material layer stack so as to form sidewalls as said exposed surface areas of said titanium nitride material.

6. The method of claim 5, wherein said gate dielectric layer comprises a high-k dielectric material.

7. The method of claim 5, wherein performing said one or more further processes comprises forming a transistor element on the basis of said titanium nitride material.

8. The method of claim 7, wherein forming said transistor element comprises forming a strain-inducing semiconductor alloy in said semiconductor region and using said dielectric material formed on said sidewalls so as to adjust a lateral offset of said strain-inducing semiconductor alloy from said material layer stack.

9. The method of claim 8, wherein said semiconductor alloy comprises a compressive strain-inducing semiconductor material.

10. The method of claim 8, wherein said semiconductor alloy comprises a tensile strain-inducing semiconductor material.

11. The method of claim 1, wherein passivating said at least one exposed surface area of said titanium nitride material comprises forming a titanium and oxygen-containing material on said at least one exposed surface area.

12. A method, comprising:

forming a gate electrode structure on a semiconductor region of a semiconductor device, said gate electrode structure comprising a titanium nitride layer;

forming a protective liner on sidewalls of said gate electrode structure;

after forming said protective liner, performing a treatment on the basis of an oxygen species in a substantially acid-free environment, wherein performing said treatment comprises passivating exposed surface portions of said titanium nitride layer;

performing a cleaning process on said gate electrode structure including said protective liner on the basis of sulfuric acid; and forming a transistor element by using said gate electrode structure including said protective liner.

13. The method of claim 12, wherein performing said treatment on the basis of an oxygen species comprises performing a plasma treatment.

14. The method of claim 12, wherein performing said treatment on the basis of an oxygen species comprises establishing a reactive gaseous ambient including said oxygen species.

15. The method of claim 12, wherein said cleaning process is performed after performing said treatment on the basis of an oxygen species.

16. The method of claim 12, wherein forming said protective liner comprises depositing a silicon and nitrogen-containing dielectric material and etching said dielectric material.

17. The method of claim 16, wherein said silicon and nitrogen-containing dielectric material is formed with a layer thickness of 5 nm or less.

18. The method of claim 12, wherein forming said gate electrode structure comprises forming a gate dielectric layer comprising a high-k dielectric material and forming said titanium nitride material on said gate dielectric layer.

19. The method of claim 18, wherein forming said gate electrode structure results in a first length of said gate electrode structure at a top thereof and in a second length at a bottom, and wherein said second length is greater than said first length.

20. The method of claim 19, wherein said first length is approximately 40 nm or less.

21. The method of claim 12, wherein performing said treatment comprises forming an oxygen-containing material on said exposed surface portions.

22. A method, comprising:

forming a metal gate electrode structure on a semiconductor region of a semiconductor device, said metal gate electrode structure comprising a high-k gate dielectric material and a metal layer formed above said high-k gate dielectric material, said metal layer comprising a plurality of exposed surface portions;

forming a protective liner on sidewalls of said gate electrode structure, said protective liner covering at least some of said plurality of exposed surface portions;

after forming said protective liner, passivating at least one exposed surface portion of said metal layer, wherein passivating said at least one exposed surface portion comprises oxidizing said at least one exposed surface portion;

after passivating said at least one exposed surface portion of said metal layer, exposing said metal gate electrode structure and said protective liner to a process ambient comprising sulfuric acid; and forming a transistor element using said metal gate electrode structure and said protective liner.

* * * * *